(12) United States Patent
Han et al.

(10) Patent No.: US 9,711,352 B2
(45) Date of Patent: Jul. 18, 2017

(54) LARGE-AREA, LATERALLY-GROWN EPITAXIAL SEMICONDUCTOR LAYERS

(71) Applicant: Yale University, New Haven, CT (US)

(72) Inventors: Jung Han, Woodbridge, CT (US); Jie Song, New Haven, CT (US); Danti Chen, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 14/776,634

(22) PCT Filed: Mar. 14, 2014

(86) PCT No.: PCT/US2014/029219
§ 371 (c)(1),
(2) Date: Sep. 14, 2015

(87) PCT Pub. No.: WO2014/144698
PCT Pub. Date: Sep. 18, 2014

(65) Prior Publication Data
US 2016/0027636 A1     Jan. 28, 2016

Related U.S. Application Data

(60) Provisional application No. 61/789,082, filed on Mar. 15, 2013.

(51) Int. Cl.
*H01L 21/20*     (2006.01)
*H01L 21/02*     (2006.01)
(Continued)

(52) U.S. Cl.
CPC .......... *H01L 21/0254* (2013.01); *C30B 25/04* (2013.01); *C30B 29/406* (2013.01);
(Continued)

(58) Field of Classification Search
CPC .......................... H01L 21/76248; C30B 25/02
(Continued)

(56) References Cited

U.S. PATENT DOCUMENTS 4,948,456 A * 8/1990 Schubert ................. C30B 23/04
117/90
4,952,526 A    8/1990 Pribat et al.
(Continued)

OTHER PUBLICATIONS

International Search Report and Written Opinion dated Sep. 22, 2014 from corresponding International Application PCT/US2014/029219.
(Continued)

*Primary Examiner* — Sitaramarao S Yechuri
(74) *Attorney, Agent, or Firm* — Wolf, Greenfield & Sacks, P.C.

(57) ABSTRACT

Structures and methods for confined lateral-guided growth of a large-area semiconductor layer on an insulating layer are described. The semiconductor layer may be formed by heteroepitaxial growth from a selective growth area in a vertically-confined, lateral-growth guiding structure. Lateral-growth guiding structures may be formed in arrays over a region of a substrate, so as to cover a majority of the substrate region with laterally-grown epitaxial semiconductor tiles. Quality regions of low-defect, stress-free GaN may be grown on silicon.

31 Claims, 14 Drawing Sheets

(51) Int. Cl.
*C30B 25/04* (2006.01)
*C30B 29/40* (2006.01)
*H01L 23/498* (2006.01)

(52) U.S. Cl.
CPC .... *H01L 21/0262* (2013.01); *H01L 21/02381* (2013.01); *H01L 21/02422* (2013.01); *H01L 21/02433* (2013.01); *H01L 21/02458* (2013.01); *H01L 21/02639* (2013.01); *H01L 21/02647* (2013.01); *H01L 23/49827* (2013.01); *H01L 2924/0002* (2013.01)

(58) Field of Classification Search
USPC .......................................................... 257/737
See application file for complete search history.

(56) References Cited

U.S. PATENT DOCUMENTS

| | | | |
|---|---|---|---|
| 5,356,510 A | 10/1994 | Pribat et al. | |
| 5,587,014 A | 12/1996 | Iyechika et al. | |
| 6,617,668 B1 * | 9/2003 | Koide | C30B 25/02 117/902 |
| 7,390,750 B1 * | 6/2008 | Ramkumar | H01L 21/0337 438/706 |
| 7,727,874 B2 | 6/2010 | Hanser et al. | |
| 8,252,684 B1 | 8/2012 | Lee et al. | |
| 2002/0179911 A1 | 12/2002 | Linthicum et al. | |
| 2002/0189534 A1 | 12/2002 | Tang et al. | |
| 2003/0211713 A1 | 11/2003 | Suguro et al. | |
| 2004/0175844 A1 | 9/2004 | Yang et al. | |
| 2004/0261692 A1 | 12/2004 | Dwilinski et al. | |
| 2005/0184307 A1 | 8/2005 | Li et al. | |
| 2006/0131606 A1 | 6/2006 | Cheng | |
| 2006/0292719 A1 | 12/2006 | Lochtefeld et al. | |
| 2007/0017439 A1 | 1/2007 | Xianyu et al. | |
| 2007/0080369 A1 * | 4/2007 | Sakai | H01L 33/007 257/103 |
| 2008/0042543 A1 | 2/2008 | Conrad | |
| 2008/0093622 A1 * | 4/2008 | Li | H01L 21/02381 257/103 |
| 2009/0001416 A1 | 1/2009 | Chua et al. | |
| 2009/0098343 A1 | 4/2009 | Arena et al. | |
| 2010/0012948 A1 | 1/2010 | Usikov et al. | |
| 2010/0102307 A1 * | 4/2010 | Chua | C30B 25/02 257/43 |
| 2010/0117188 A1 | 5/2010 | Waldrab et al. | |
| 2010/0171176 A1 | 7/2010 | Wells | |
| 2010/0187568 A1 | 7/2010 | Arena | |
| 2010/0210067 A1 | 8/2010 | Butcher et al. | |
| 2011/0065264 A1 | 3/2011 | Moffatt et al. | |
| 2011/0244663 A1 | 10/2011 | Su | |
| 2011/0254134 A1 | 10/2011 | Detchprohm et al. | |
| 2011/0292957 A1 | 12/2011 | Bhat et al. | |
| 2012/0025195 A1 | 2/2012 | McComber et al. | |
| 2012/0043528 A1 | 2/2012 | Lo et al. | |
| 2012/0104558 A1 | 5/2012 | Ishibashi | |
| 2012/0112603 A1 | 5/2012 | Masaki | |
| 2012/0115293 A1 | 5/2012 | Noh et al. | |
| 2013/0001682 A1 | 1/2013 | Tang et al. | |
| 2013/0015492 A1 | 1/2013 | Hashimoto et al. | |
| 2013/0294782 A1 | 11/2013 | Liboiron-Ladouceur et al. | |

OTHER PUBLICATIONS

International Preliminary Report on Patentability for PCT/US2014/029219 mailed Sep. 24, 2015.

Honda et al., Growth of GaN free from cracks on a (111) Si substrate by selective metalorganic vapor-phase epitaxy. Appl Phys Lett. Jan. 14, 2002;80(2):222-4.

Kawaguchi et al., Influence of polarity on carrier transport in semipolar (2021) and (2021) multiple-quantum-well light-emitting diodes. Appl Phys Lett. 2012;100:231110.1-4.

Piprek, Efficiency droop in nitride-based light-emitting diodes. Physica Status Solidi (a). Oct. 2010;207(10):2217-25.

Pribat et al., Conformal vapor phase epitaxy. Appl Phys Lett. 1989;55(24):2544-6. doi: 10.1063/1.101976.

Pribat et al., Defect-free, conformally grown (100) GaAs films. Appl Phys Lett. Jul. 1990;57(4):375-7. doi: 10.1063/1.103696.

Shubert et al., Confined Lateral Selective Epitaxial Growth of Silicon for Device Fabrication. IEEE Electron Device Letters. May 1990;11(5):181-3.

* cited by examiner

LARGE-AREA, LATERALLY-GROWN EPITAXIAL SEMICONDUCTOR LAYERS

CROSS REFERENCE TO RELATED APPLICATIONS

This application is a national stage filing under 35 U.S.C. §371 of International PCT Application No. PCT/US2014/029219 filed Mar. 14, 2014 entitled "LARGE-AREA, LATERALLY-GROWN EPITAXIAL SEMICONDUCTOR LAYERS," which claims the benefit under 35 U.S.C. §119 (e) of U.S. Provisional Application Ser. No. 61/789,082 filed Mar. 15, 2013, each of which applications is incorporated herein by reference to the maximum extent allowable by law.

GOVERNMENT FUNDING

This invention was made with government support under Grant No. DE-SC0001134 awarded by the Department of Energy. The government has certain rights in the invention.

BACKGROUND

Technical Field

The technology relates to heteroepitaxial lateral overgrowth of semiconductor layers in vertically-confined geometries.

Discussion of the Related Art

Bulk silicon is a semiconductor material that is widely used for microfabrication of integrated circuits and other microstructure devices. Silicon is widely available and inexpensive, and the integrated electronics and microfabrication industries have developed many tools and processes for silicon-based technologies. Although silicon is widely used, other semiconductor materials can be desirable for certain microelectronic devices.

For example, gallium nitride (GaN) is a wide-bandgap semiconductor material that has useful applications in the areas of power electronics and light-emitting or detecting devices. Because of its wide bandgap, gallium nitride exhibits high breakdown voltages, an attractive property for power-electronic or high-voltage devices. When used for lighting applications, gallium nitride is capable of emitting or detecting short wavelength radiation in the blue and ultraviolet regions of the optical spectrum. Gallium nitride is widely used as the semiconductor material of choice for blue light emitting diodes (LEDs) and laser diodes (LDs). The advent of high brightness blue LEDs has revolutionized the lighting industry.

Although gallium nitride is an attractive material for certain applications, it can be a difficult or expensive material to form into large-area substrates for microfabrication purposes. One approach to forming large-area substrates of semiconductor materials other than silicon is to heteroepitaxially grow a layer of a selected semiconductor material onto the surface of a silicon substrate. FIG. 1 depicts a structure associated with conventional heteroepitaxy of gallium nitride on a substrate. According to some conventional methods, a seed layer 120 may be formed on a substrate 110. The seed layer 120 may be a crystalline material such as aluminum nitride (AlN). After the seed layer has been formed on the substrate, a layer of gallium nitride 130 may be heteroepitaxially grown from the seed layer. In some cases, the substrate may be a silicon substrate and oriented to have a crystallographic plane of (111) on its surface between the seed layer 120 and the substrate 110. The gallium nitride layer 130 may be grown by metalorganic chemical-vapor deposition (MOCVD), for example.

Conventionally, epitaxial growth of gallium nitride on a silicon substrate is difficult to achieve, because there is a significant lattice mismatch between the crystal lattice of the gallium nitride in the crystal lattice of the silicon substrate of about 17%. To mitigate the effects of the lattice mismatch, a seed layer 120 or multi-layers may be formed on the silicon substrate 110. Even with the use of a seed layer, the epitaxial grown gallium nitride may form with defects 135. The defects 135 may include stacking faults and dislocations as a well as other types of defects. The concentration of defects in the gallium nitride layer can be high when the gallium nitride is grown vertically from the substrate or seed layer. In some instances with thick gallium nitride layers, the defects can be in excess of $10^8$ defects per centimeter squared ($10^8$ cm$^{-2}$). For many integrated circuit applications, this level of defects is too high to provide satisfactory device performance.

SUMMARY

Structures and methods for vertically-confined, lateral-guided growth of large-area semiconductor layers on an insulating layer are described. The semiconductor layer may be formed by heteroepitaxial growth from a selective growth area in a confined growth-guiding region, and can exhibit lateral-to-vertical growth ratios of about 30 or greater. The lateral-growth guiding structures may be formed in arrays over a region of a substrate, so as to cover a majority of the substrate region with laterally-grown, hetroepitaxial semiconductor tiles. Quality regions of low-defect, stress-free GaN may be grown on insulated silicon.

According to some embodiments, a method for covering an area of a substrate with a semiconductor may comprise acts of forming a first insulating layer to cover a crystal seed structure, wherein the first insulating layer also covers the area of the substrate, and opening at least one via in the first insulating layer to expose at least one selective growth area that exposes a surface area of the seed structure. The method may further comprise forming a second insulating layer parallel to the first insulating layer and spaced apart from the first insulating layer by a distance, and removing a sacrificial material between the second insulating layer and first insulating layer region to form a lateral-growth guiding region for at least one selective growth area. In various implementations, the method comprises heteroepitaxially growing the semiconductor under first growth conditions into the lateral-growth guiding region from the at least one selective growth area, removing the second insulating layer, and epitaxially growing the semiconductor under second growth conditions to form at least one semiconductor tile covering a portion of the area of the substrate.

According to some aspects, the distance is between approximately 0.2 μm and approximately 2 μm. The lateral extent of the at least one via in the first insulating layer may be between approximately 0.2 μm and approximately 10 μm. According to some implementations, the semiconductor is gallium nitride.

In some implementations, a method for covering an area of a substrate with a semiconductor may comprise growing the gallium nitride under the first growth conditions to a lateral extent between approximately 5 μm and approximately 50 μm from the at least one via, and wherein the distance between the insulating layer and cover layer is between approximately 0.2 μm and approximately 2 μm. In some aspects, a method may further comprise growing the gallium nitride tile to a thickness between approximately 0.2 µm and approximately 2 µm. In some implementations, growing the GaN under the first growth conditions comprises forming a close-packed plane of the GaN parallel to a direction of the lateral growth.

In some aspects, both the first growth conditions and the second growth conditions comprise providing a first gas containing nitrogen and a second gas containing gallium to the selective growth area. According to some implementations, the first gas is ammonia and the second gas is trimethylgallium. In some aspects, a ratio of gallium to nitrogen for the second growth condition is higher than a ratio of gallium to nitrogen for the first growth condition. In some implementations, a pressure for the first growth condition is approximately equal to or higher than a pressure for the second growth condition. In some implementations, a temperature for the second growth condition is approximately equal to or higher than a temperature for the first growth condition. In some aspects, a temperature for the first growth conditions is between approximately 950° C. and approximately 1050° C. In some aspects, a pressure for the first growth condition is between approximately 100 mbar and approximately 400 mbar. In some implementations, a flow rate of the first gas for the first growth condition is between approximately 0.5 slm to approximately 3 slm. In some aspects, a flow rate of the second gas for the first growth condition is between approximately 40 µmol per minute and approximately 110 µmol per minute.

According to some aspects, a temperature during the second growth condition is between approximately 1050° C. and approximately 1100° C. In some implementations, a pressure during the second growth condition is between approximately 40 mbar and approximately 100 mbar. In some implementations, a flow rate of the first gas for the second growth condition is between approximately 2 slm and approximately 5 slm. In some implementations, a flow rate of the second gas for the second growth condition is between approximately 20 µmol per minute and approximately 40 µmol per minute.

In some implementations of a method for covering an area of a substrate with a semiconductor, forming the first insulating layer may comprise depositing a dielectric material to cover the crystal seed structure. The dielectric material may comprise a silicon nitride or a silicon oxide. In some aspects, opening at least one via in the first insulating layer comprises etching a hole through the first insulating layer. In some aspects, the seed structure comprises aluminum nitride. In some implementations, the seed structure comprises a multilayer stack including at least one layer of gallium nitride.

According to some implementations, the second insulating layer comprises an oxide or a nitride. A method for covering an area of a substrate with a semiconductor may further comprise depositing the sacrificial material over the first insulating layer, and depositing the second insulating layer over the sacrificial material. In some implementations, the sacrificial material comprises polysilicon. A method may further include etching vias through the sacrificial material to expose surface areas of the first insulating layer. In some implementations, forming the second insulating layer comprises filling the vias in the sacrificial material with the second insulating material.

In some aspects, removing the sacrificial material comprises etching the sacrificial material with a wet or dry etching process. According to some implementations, the dry etching process comprises an etching process that uses the gas $XeF_2$. In some aspects, a pressure during the dry etching process is between approximately 1 Torr and approximately 20 Torr. In some aspects, a flow rate of the $XeF_2$ is between approximately 0.5 slm and approximately 2 slm.

The foregoing aspects and implementations of acts may be included in any suitable combination and any suitable order in a method for covering an area of a substrate with a semiconductor.

Structures associated with the above-describe methods are also contemplated. According to some embodiments, a lateral-growth guiding structure may comprise a first insulating layer covering a first area of a seed structure disposed on a substrate, and an opening in the first insulating layer that exposes a surface area of the seed structure. The exposed surface area may be even with a surface of the seed structure covered by the first insulating layer, according to some embodiments. A lateral-growth guiding structure may further comprise a second insulating layer having a second area less than the first area of the seed structure and spaced a distance from the first insulating layer, wherein the second area is substantially centered around the opening in the first insulating layer. The guiding structure may also include gas-inlet openings located at a periphery of the second insulating layer.

In some aspects, the distance between the first insulating layer and second insulating layer is between approximately 0.2 µm and approximately 2 µm. In some implementations, a lateral extent of the second insulating layer is between approximately 5 µm and approximately 50 µm. In some implementations, a lateral extent of the opening in the first insulating layer is between approximately 0.2 µm and approximately 10 µm. In some aspects, the seed structure comprises aluminum nitride.

According to some implementations, a lateral-growth guiding structure may further comprise pillars supporting the second insulating layer apart from the first insulating layer. The pillars may be formed from the second insulating layer.

In some implementations, the first insulating layer comprises an oxide or a nitride. In some implementations, the second insulating layer comprises an oxide or a nitride. According to some implementations, the area of the second insulating layer is in the shape of a circle or hexagon. In some aspects, there may be a plurality of lateral-growth guiding structures as described above spaced at regular intervals on a substrate.

The foregoing implementations and aspects relating to a lateral-growth guiding structure may be included in any suitable combination for one or more embodiments of a lateral-growth guiding structure. Any of the above-described method embodiments may be used to fabricate any embodiment of a lateral-growth guiding structure.

The lateral-growth guiding structures and methods described above may be used to form tiles of heteroepitaxially-grown semiconductor materials on an insulated substrate. According to some embodiments, a tiled semiconductor substrate may comprise an insulating layer formed over a seed structure, a plurality of vias formed through the insulating layer, and a plurality of separated semiconductor tiles laterally grown from each via.

In some aspects, the semiconductor tiles are formed of GaN. According to some implementations, the seed structure comprises AlN. In some implementations, each semiconductor tile is substantially centered on a via. In some implementations, at least one semiconductor tile is hexagonally shaped. In some aspects, a lateral extent of each via is between approximately 0.5 µm and approximately 10 µm.

According to some implementations, a lateral dimension of the semiconductor tiles is between approximately 5 μm and approximately 50 μm. In some aspects, a thickness of each tile is between approximately 0.2 μm and approximately 2 μm. In some implementations, the insulating layer is an oxide, a nitride, or a high-k dielectric.

In some aspects, a defect density is highest at a center of each tile. In some implementations, a center of each tile has strain and an outer region of each tile has no strain.

The foregoing implementations and aspects relating to tiles of heteroepitaxially-grown semiconductor materials may be included in any suitable combination in various embodiments of the tiles. Any of the above-described method embodiments may be used to fabricate any embodiment of tiles of heteroepitaxially-grown semiconductor materials.

The foregoing and other aspects, implementations, embodiments, and features of the present teachings can be more fully understood from the following description in conjunction with the accompanying drawings.

BRIEF DESCRIPTION OF DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

FIGS. 6B-6F are SEM images showing results from lateral guided heteroepitaxial growth experiments;

Figure 1:
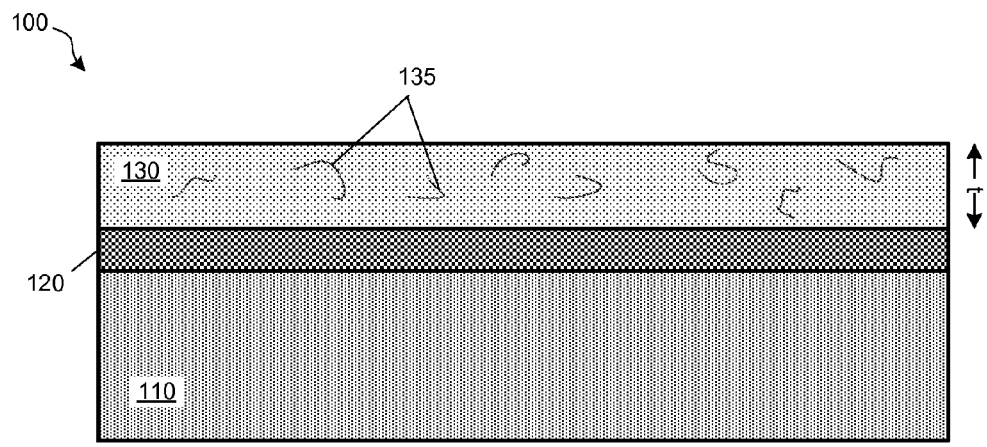
FIG. 1 depicts a heteroepitaxial layer of gallium nitride formed on a substrate according to conventional methods.

The features and advantages of the embodiments will become more apparent from the detailed description set forth below when taken in conjunction with the drawings.

DETAILED DESCRIPTION

Various structures and techniques are described for heteroepitaxial, lateral-guided growth of semiconductors for microfabrication and microelectronics applications. The structures and techniques may be used to form thin-film semiconductor layers on an insulating film, according to some embodiments. For example, thin films of GaN may be formed on an insulating layer disposed on a substrate. In some embodiments, the structures and techniques may be used to form tiles of laterally-grown, semiconductor material, so as to cover a majority of a surface of a substrate or wafer. In various embodiments, regions of the laterally-grown, semiconductor may be stress free and of low defect density.

The inventors have recognized that heteroepitaxial growth of certain semiconductors (e.g., gallium nitride) on silicon remains to be a challenging microfabrication problem. There are a number of technical issues that make heteroepitaxial growth of GaN difficult. The technical issues include a lattice mismatch between Si(111) and GaN(0001) of a daunting 17%. The expressions "(111)" and "(0001)" refer to the crystal orientation of the Si and GaN materials. Because of the lattice mismatch, generation of threading dislocations is inevitable and these dislocations can be responsible for premature breakdown in GaN-based electronic devices. An additional challenge is the mismatch in thermal expansion between Si and GaN, which can cause the GaN device layers to be under tensile stresses (>1 GPa) upon cooling after formation of a GaN layer. This stress can lead to severe cracking and/or fracturing of the GaN layer as well as substrate or wafer bowing. Material stress, dislocations, and fractures can result in semiconductor material with a high defect density that is unsuitable for integrated circuit applications. Wafer bowing, due to tensile strain of GaN, scales proportionally with the diameter of the wafer. Wafer bowing can inhibit subsequent lithography. To date, there is no clear manufacturing pathway for heteroepitaxially-grown GaN/Si to reach 12" wafer sizes and beyond. To mitigate stress, growth of complicated AlN/GaN superlattices or AlGaN compositional graded buffer layers have been employed. However, these multi-layer and graded buffers can have serious implications in terms of material quality, sample uniformity, electrical breakdown, cost of epitaxy, and ultimately, device yield. Additional technical issues relate to silicon substrates that cannot be easily made insulating. For example, the use of Si(111) substrates presents an unintentional leakage path under high-electric field operation that can severely limit the breakdown voltage of a GaN device. Further, there can be a chemical incompatibility between GaN and Si, and this can cause "back-etching" problems. Additionally, GaN on Si(111) may not be compatible with mainstream CMOS circuits or microfabrication processes for mainstream CMOS circuits. Monolithic integration of GaN power electronic devices with Si(100) substrates would be more compatible with mainstream CMOS circuits and processes. The inventors have developed structures and microfabrication processes that can produce cost-effective GaN layers on Si substrates for power electronics and optoelectronics applications that can overcome some of the challenges described above.

According to some embodiments, confined lateral-guided growth (CLGG) may be used to heteroepitaxially grow GaN on a Si substrate with high quality and reduced strain. In some embodiments, the GaN may be formed in tiles, so as to cover a majority of a large sized Si substrate (e.g., substrate or wafer sizes larger than 100 mm in diameter in some embodiments, larger than 200 mm in some embodiments, and yet larger than 400 mm in some embodiments). The concept improves over epitaxial lateral overgrowth (ELO), in which a heteroepitaxially grown material grows laterally and vertically from a seed structure on a substrate. In ELO, a lateral-to-vertical growth ration is typically less than about 5.

For CLGG, a later-growth guiding structure 200 (depicted in FIG. 2A) comprising a dielectric confining cover layer 250 and an underlying insulation layer 230 vertically confines growth of a semiconductor layer, such that a crystalline semiconductor will grow mostly laterally in a confined region 240. Confined lateral-guided growth can provide advantages for device fabrication. For example, the strain in the grown crystal may be reduced due to decreased interfacial contact area between the heteroepitaxially-grown crystal and an underlying substrate. As a result, the density of vertical dislocations and defects can be reduced. For example, dislocations in the crystal generated from the lattice mismatch at the interface between the crystal and substrate may bend laterally and dissipate as the crystal grows. In some embodiments, the defects may be trapped by the confining insulating or dielectric layers. Additionally, very high lateral-to-vertical (L/V) growth rates can be achieved. In some embodiments, L/V growth rates greater than 30 are possible. Combining GaN CLGG epitaxy with modern microelectronic fabrication techniques can present new opportunities and solutions to problems not easily addressable in conventional heteroepitaxy. Such confined, lateral growth can avoid problems of excessive vertical growth in conventional heteroepitaxy and enable coverage of very large area silicon substrates with semiconductors such as GaN.

Figure 2A:
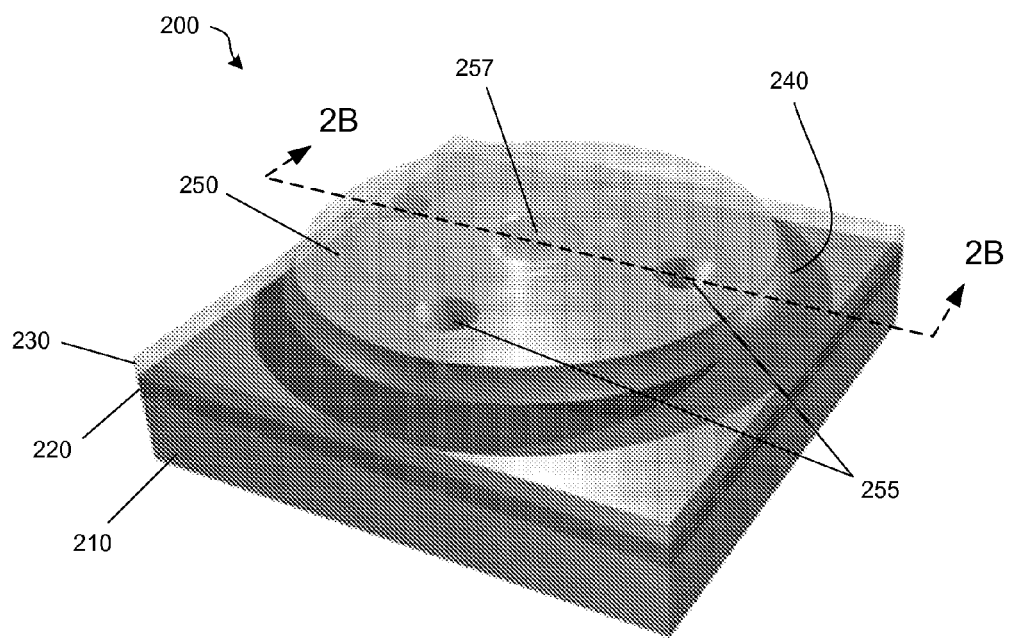
FIG. 2A depicts a perspective view of a lateral-growth guiding structure, according to some embodiments.

FIG. 2A depicts a lateral-growth guiding structure 200, according to some implementations. In some embodiments, a lateral-growth guiding structure 200 may be formed on a substrate 210 that may be covered with a seed structure 220. The lateral-growth guiding structure 200 may comprise a first insulating layer 230 and a confining cover layer 250. The confining cover layer may be supported above the first insulating layer 230 by a plurality of pillars 255. At or near the center of the cover layer 250 there may be a depression 257. Between the confining cover layer 250 in the first insulating layer 230 there may be a lateral-growth guiding region 240. Gallium nitride or any suitable semiconductor material may be grown in the lateral-growth guiding region 240, according to some embodiments.

The substrate may be any suitable semiconductor substrate (e.g., silicon (Si), germanium (Ge), or any suitable compound semiconductor) in some embodiments, or may be a glass or a ceramic in other embodiments. In some embodiments, the substrate 210 may be a silicon(111) substrate. In other embodiments, the substrate 210 may be a silicon(100) substrate. In some implementations the substrate may comprise a compound semiconductor having any suitable crystallographic orientation. According to some embodiments the substrate may comprise a glass such as quartz or sapphire. The substrate may be of any suitable size, and may be in the form of a chip or a semiconductor wafer. According to some embodiments, the substrate 210 comprises a semiconductor wafer having a diameter between about 100 mm and about 450 mm. In some implementations, the wafer may have a diameter greater than 450 mm.

The seed structure 220 may comprise a single layer of material, or may comprise multiple layers of different materials. In some implementations, the seed structure 220 may comprise a layer of aluminum nitride (AlN). In some embodiments the seed structure 220 may comprise alternating layers of aluminum nitride and gallium nitride. The seed structure may be formed by any suitable deposition process (e.g., vapor phase epitaxial growth, plasma deposition, atomic layer deposition). The seed structure may have a thickness between approximately 50 nm and approximately 500 nm.

The first insulating layer 230 may be formed of an oxide or a nitride according to some embodiments. In some implementations, the first insulating layer may comprise a high dielectric constant (high-K) material. In some embodiments, the first insulating layer is formed of silicon oxide. In some implementations, the first insulating layer may be formed as a multi-layer stack of different insulating materials. The first insulating layer may have a thickness between about 50 nm and about 250 nm, and provide electrical insulation between the substrate and a laterally-grown semiconductor layer. The first insulating layer may be formed by any suitable deposition process which may include plasma deposition, physical deposition such as sputtering or electric beam evaporation, chemical vapor deposition, or atomic layer deposition.

According to some embodiments, the confining cover layer 250 may be formed of an oxide or a nitride. The confining cover layer may be formed of a same material as the first insulating layer. The thickness of the confining cover layer 250 may be between approximately 50 nm and approximately 500 nm, according to some embodiments, though in other embodiments the confining cover layer may have a thickness up to about 3 microns. The confining cover layer may be patterned such that there are gas-inlet openings at its periphery for gas to enter into the lateral-growth guiding region 240. The pillars 255 may be distributed across the confining cover layer in any suitable manner. In some implementations, the cover layer 250 may be formed of a non-insulating material.

Figure 2B:
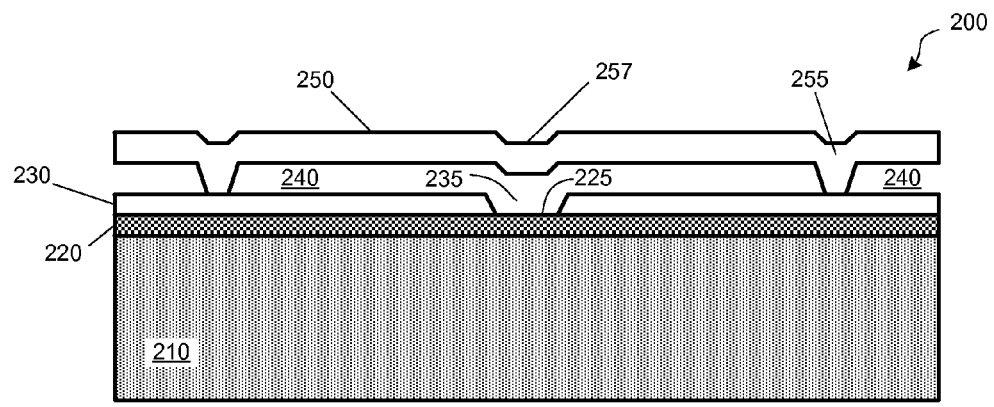
FIG. 2B depicts an elevation view of a lateral-growth guiding structure, according to some embodiments.

FIG. 2B shows an elevation view of the lateral-growth guiding structure 200 shown in FIG. 2A. According to some embodiments, the lateral-growth guiding region 240 extends from the periphery of the confining cover layer to a central region underneath the depression 257. Within the central region there may be an opening 235 in the first insulating layer 230. The opening region may expose a surface of the seed structure 220. The exposed surface of the seed structure 220 may be referred to as a selective growth area 225. In various embodiments, GaN (or any other suitable semiconductor) will grow from the selective growth area 225 and advance throughout the lateral-growth guiding region 240.

FIGS. 3A-3G depict structures associated with an embodiment of a method for fabricating a lateral-growth guiding structure 200, according to some embodiments. In some implementations, there may be more microfabrication steps or fewer steps than those described in connection with the structures depicted in FIGS. 3A-3G.

Figure 3A:
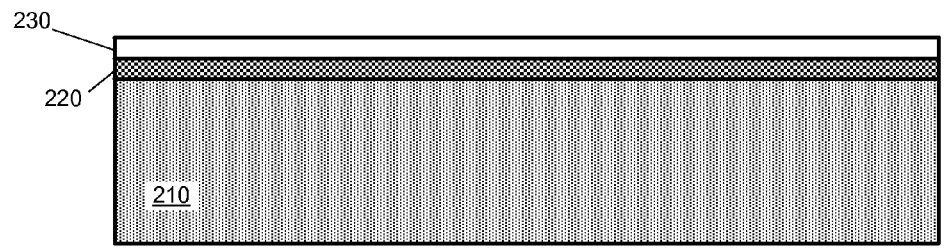
FIGS. 3A-3G depict structures associated with a method of fabricating a lateral-growth guiding structure, according to some embodiments.

According to some embodiments, a substrate 210 may be obtained or provided with a first insulating layer 230 formed over a seed structure 220, as depicted in FIG. 3A. In some implementations, FIG. 3A may be representative of a small region of a substrate. The substrate may comprise any suitable semiconductor material, a glass, or a ceramic material. In some embodiments, the substrate 210 may comprise a silicon(111) or a silicon(100) substrate having a low defect density that is suitable for integrated circuit microfabrication applications. Other crystallographic orientations and/or other semiconductor materials may be used for the substrate in other embodiments. The substrate may be any suitable size and shape. In some implementations, the substrate is a silicon wafer having a diameter between approximately 100 mm and approximately 450 mm, though in some implementations smaller or larger sizes may be used. According to some embodiments, substrate 210 may comprise a chip or custom-sized substrate. In some implementations, substrate 210 may comprise a semiconductor-on-insulator substrate. The substrate may have any suitable thickness which may range from approximately 10 μm to approximately 3 mm.

Seed structure 220 may be formed over an upper surface of substrate 210 using any suitable deposition process. In some embodiments, seed structure 220 may be formed by metalorganic chemical vapor deposition (MOCVD) or atomic layer deposition (ALD). In some implementations, the seed structure may be formed by a plasma deposition process. In some cases, the seed structure may be annealed to improve the crystalline quality of the seed structure. In various embodiments, the seed structure 220 has a substantially single crystalline upper surface. According to some embodiments, the seed structure 220 comprises a single layer of material, though in other embodiments the seed structure may comprise multiple layers of materials. According to one implementation, the seed structure 220 comprises aluminum nitride (AlN). In other embodiments, the seed structure may comprise alternating layers of gallium nitride with a second material such as aluminum nitride. The seed structure 220 may have a thickness ranging between approximately 5 nm and approximately 200 nm.

The first insulating layer 230 may comprise an oxide or a nitride. In some embodiments, the first insulating layer may comprise a high-dielectric-constant (high-K) material. In some embodiments, the first insulating layer may comprise silicon oxide or silicon nitride. The thickness of the first insulating layer 230 may be between approximately 20 nm and approximately 200 nm. The insulating layer 230 may be formed on the seed structure 220 by any suitable deposition process. For example, the first insulating layer may be deposited by a chemical vapor deposition (CVD), plasma enhanced chemical vapor deposition (PECVD), atomic layer deposition (ALD), or physical deposition such as electron beam evaporation or sputtering. In some implementations, the first insulating layer may be applied as a spin on glass that is subsequently heated. In some embodiments, the first insulating layer 230 may be annealed at a high temperature to improve the quality of the layer.

Figure 3B:
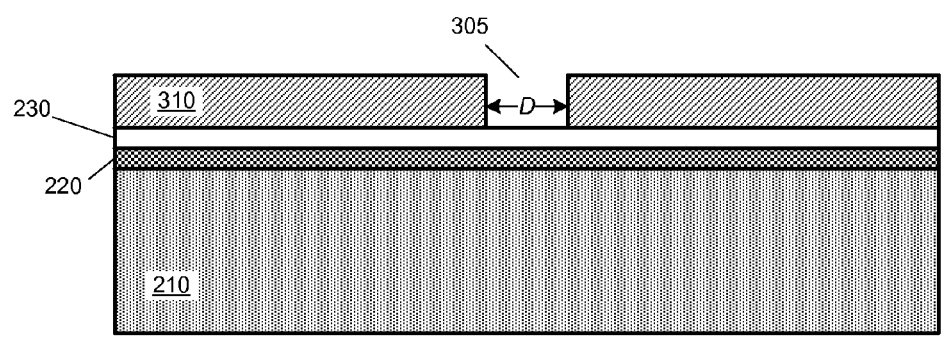

According to some embodiments, a photoresist 310 may be formed over the first insulating layer 230, as depicted in FIG. 3B. The photoresist may be any suitable photoresist that can serve as an etch mask for insulating layer 230, e.g., the photoresist exhibits etch selectivity over the insulating layer. The photoresist may be exposed and developed to form an opening 305 in the photoresist, as shown in the drawing. After the photoresist has been developed, the substrate may be subjected to a cleaning etch to remove any residual undeveloped photoresist over the insulating layer 230 in the opening 305. The opening may have a lateral dimension D between approximately 100 nm and approximately 10 μm.

Figure 3C:
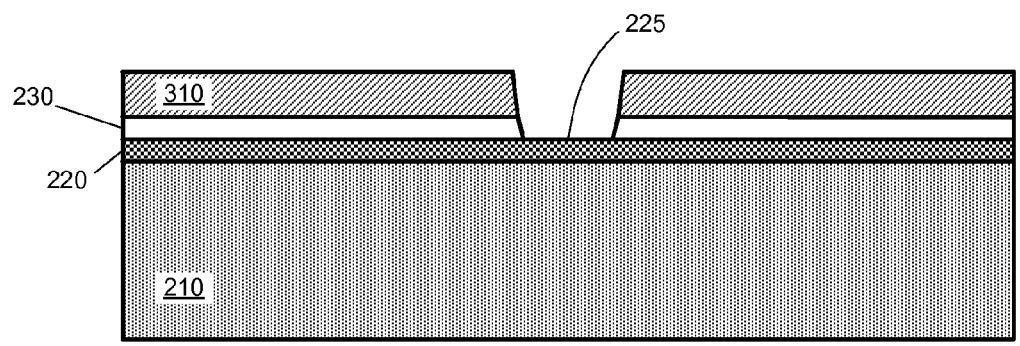

According to some implementations, the substrate may be subjected to a selective etch to remove the insulating layer 230 at the opening 305, so as to form a selective growth area 225. The resulting structure is depicted in FIG. 3C. The etching process may be a dry etch such as a reactive ion etch that uses a gas that selectively etches the insulating layer 230 but does not appreciably etch the photoresist 310 or the seed structure 220. In some embodiments, a wet etch may be used to remove the first insulating layer 230 at the opening 305. In various embodiments, the surface of the selective growth area 225 may be approximately even with the extended surface of the seed structure 220, though there may be a slight difference between the two surfaces due to a slight etching of the selective growth area. For example, the two surface planes may be within 40 nm of being co-planar.

Figure 3D:
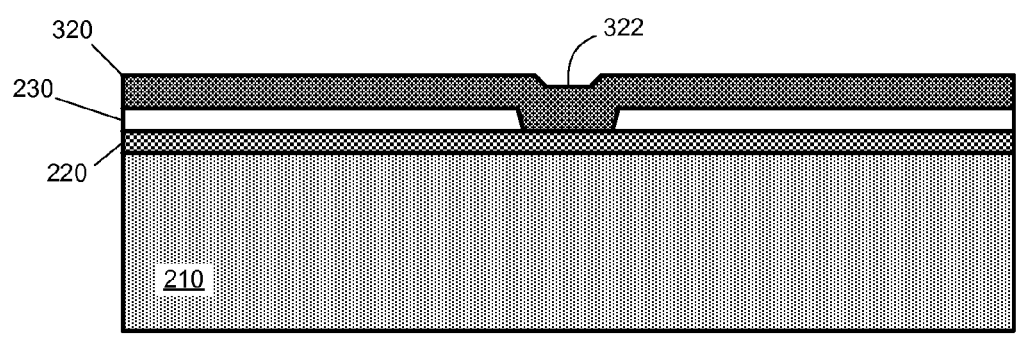

A sacrificial layer 320 may then be formed over the surface of the insulating layer and seed structure, as depicted in FIG. 3D. According to some embodiments the sacrificial layer comprises amorphous silicon. The sacrificial layer may be deposited to any suitable thickness in a range between approximately 100 nm and approximately 3 μm. In various embodiments, the sacrificial layer 320 is formed of a material that can be selectively etched over the first insulating layer 230 and the seed structure 220. After deposition of the sacrificial layer, there may be a depression 322 at the upper surface of the sacrificial layer over the opening selective growth area 225. In some embodiments there may be no depression 322. For example, after deposition of the sacrificial layer, the substrate may be subjected to a chemical-mechanical polishing (CMP) process that planarizes the upper surface of the sacrificial layer 320. The sacrificial layer may be formed across the entire substrate, or may be formed across a portion of the substrate.

Figure 3E:
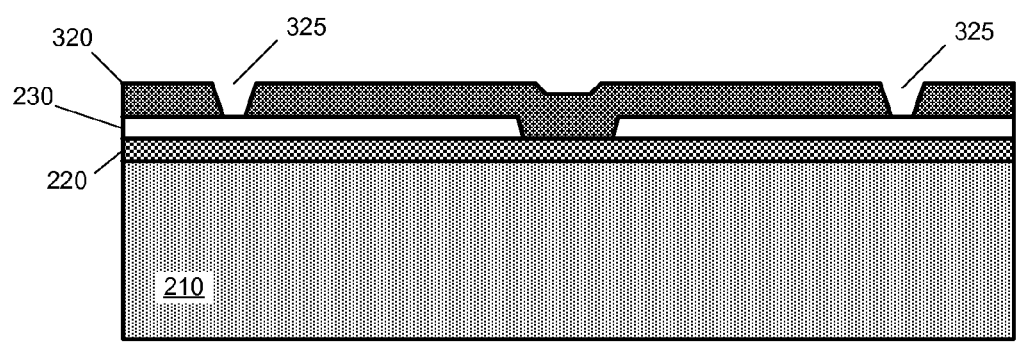

Referring now to FIG. 3E, pillar openings 325 may be formed in the sacrificial layer 320. The pillar openings may be formed by any suitable lithography process, such as the process used to form the opening 305 in the first insulating layer 230. For example, a photoresist may be formed over the sacrificial layer 320 and patterned to form openings in the photoresist at the location of the pillar openings. The sacrificial layer 320 may then be etched to form the pillar openings 325. In various embodiments the pillar openings extend down to the upper surface of the first insulating layer

230. The pillar openings 325 may be distributed in any manner above the first insulating layer 230. For example, the pillar openings 325 may be distributed in a regular array across a region of the substrate. In some embodiments, the pillar openings may be distributed (e.g., in a circle) around the selective growth area 225. There may be any number of pillar openings distributed around the selective growth area 225.

Figure 3F:
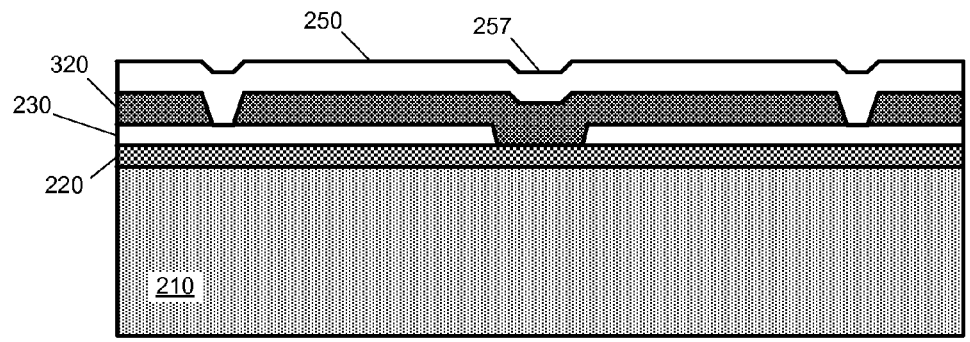

A second insulating layer or confining cover layer 250 may be deposited over the patterned sacrificial layer 320, as depicted in FIG. 3F. The cover layer 250 may comprise an oxide or a nitride, and may or may not be formed of the same material as the first insulating layer 230. In various embodiments, the cover layer exhibits etch selectivity over the sacrificial layer. The confining cover layer 250 may be deposited by any suitable deposition process, such as those described above in connection with the first insulating layer 230. In various embodiments, the confining cover layer is deposited to a depth greater than the depth of the pillar openings 325. In some embodiments, the cover layer may deposited to a depth less than the depth of the pillar openings 325 if the pillar openings have sloped sidewalls, as depicted in the drawing. As the second insulating layer fills the pillar openings, pillars are formed that will support the confining cover layer 250. There may, or may not, be a depression 257 formed over the selective growth area 225.

According to some embodiments, the confining cover layer 250 may be patterned using any suitable lithographic process to remove portions of the cover layer, at least form gas-inlet openings 253 in the confining cover layer. The openings 253 may be distributed in any suitable manner across the cover layer, in some embodiments. According to some implementations, the gas-inlet openings 253 are distributed regularly around the selective growth area 255 at or near a periphery of the cover layer 250. In some embodiments, the gas-inlet openings are formed around the fully around a periphery of the confining cover layer 250, as depicted in FIG. 2A.

Figure 3G:
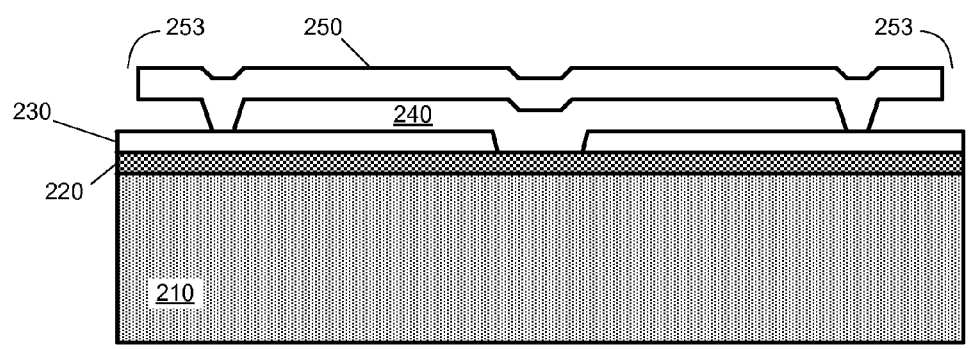

After forming openings in the cover layer 250, the substrate may be subjected to a wet or dry etch to remove the sacrificial layer 320, as depicted in FIG. 3G. The etchant may proceed through the cover layer openings 253 to remove the sacrificial layer. When the sacrificial layer is removed, a lateral-growth guiding region 240 is formed between the confining cover layer 250 and the first insulating layer 230. According to some embodiments where the sacrificial layer comprises polysilicon, a dry etchant of xenon difluoride (XeF$_2$) may be used to remove the sacrificial layer. The etching may be carried out at approximately room temperature and a pressure between approximately 1 Torr and approximately 20 Torr. The flow rate of the gas may be between approximately 0.5 standard liter per minute (slm) and approximately 2 slm. In some embodiments, improved etching was observed with the pressure between approximately 3.0 Torr and approximately 3.4 Torr. Removal of the sacrificial layer 320 exposes the selective growth area 255 at the center of the lateral-growth guiding structure 200.

FIGS. 4A-4G depict heteroepitaxial lateral-guided growth of a semiconductor in the lateral-growth guiding structure 200, according to some embodiments. In various embodiments, the epitaxially grown semiconductor 410 may be gallium nitride. The epitaxially grown gallium nitride 410 may proceed from the selective growth area 255 across the lateral-growth guiding region 240 as depicted in figure. According to some embodiments, the substrate is subjected to MOCVD using first growth conditions to grow the gallium nitride within the confined guiding region. In some embodiments the first growth conditions are carried out at a temperature between 950° C. and approximately 1050° C. Ammonia gas and trimethylgallium gas may be used as the gases to grow the gallium nitride. The pressure during the growth may be between approximately 100 mbar and approximately 400 mbar. The flow rate of the ammonia gas during the first growth conditions may be between approximately 0.5 slm and approximately 3 slm, though in other embodiments lower or higher flow rates may be used. In some embodiments, the flow rate of the trimethylgallium gas may be between approximately 40 µmol per minute and approximately 110 µmol per minute, though in other embodiments lower or higher flow rates may be used. According to some embodiments, improved growth was observed with a temperature between approximately 980° C. and approximately 1000° C., a pressure between approximately 300 mbar and approximately 400 mbar, a flow rate of the ammonia gas (NH$_3$) of approximately 0.5 slm, and a flow rate of the trimethylgallium gas (TMGa) approximately 60 µmol per minute. It was observed that unsatisfactory growth occurred with temperatures below 950° C., a pressure less than about 60 mbar, a NH$_3$ flow rate higher than approximately 5 slm, and a TMGa flow higher than approximately 110 µmol per minute. The unsatisfactory growth conditions generated a large number of polycrystals on the surface of the first insulating layer, and exhibited slow growth rates.

In various embodiments, the epitaxially-grown gallium nitride 410 may form defects near the selective growth area as it grows. In some cases, the defects may be vertical dislocations that initiate near the surface of the selective growth area 255. As the growth front of the gallium nitride advances, the vertical dislocations may bend and proceed laterally in the direction of the growth front. In some embodiments, the vertical dislocations may terminate on the confining cover layer 250 and/or the first insulating layer 230 as the gallium nitride advances in the lateral confining region 240. In some implementations, the narrow lateral confining region 240 "traps" the defects near the selective growth area 255. After termination or trapping of the defects, the gallium nitride may continue to grow throughout the confining region 240 with a low defect density. In some embodiments, the vertical threading dislocation defect density near the selective growth area 255 may be on the order of $10^8$ defects per centimeter squared or even higher. However, because of the confining geometry of the lateral-growth guiding structure, some vertical threading dislocation defects bend and propagate laterally to the large overgrowth area, where they dissipate in density. Away from the selective growth area 255, the density of defects may drop below $10^8$ cm$^{-2}$ in the base semiconductor layer, and there may be a substantially lower number of vertical threading dislocation defects. After the defects are trapped or terminated, the defect density may reduce to the order of $10^5$ defects per centimeter squared, or even lower in some embodiments.

Figure 4A:
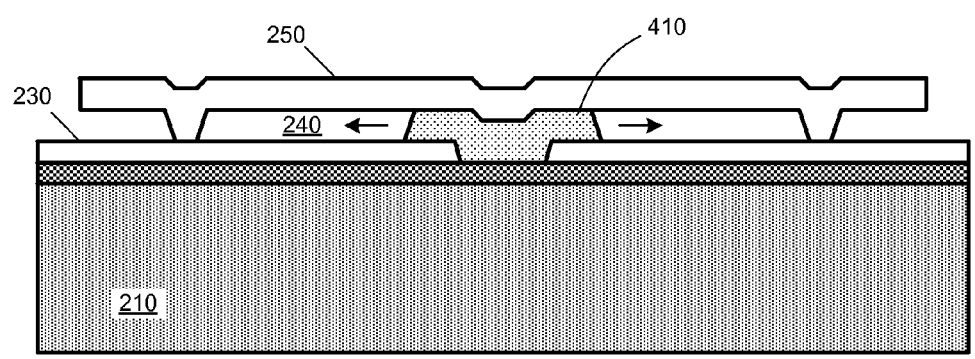
FIGS. 4A-4D illustrate heteroepitaxy of a semiconductor in a lateral-growth guiding structure, according to some implementations.
Figure 4B:
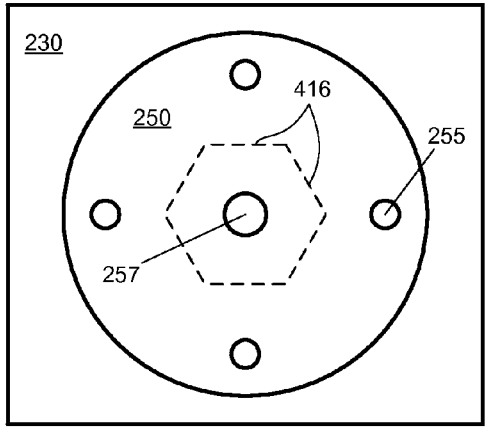

FIG. 4B shows a plan view of a lateral-growth guiding structure 200 on a substrate. For the embodiment depicted in FIG. 4B, the semiconductor (in this case gallium nitride) advances with a growth front 416 depicted as a dashed line in the drawing. According to some embodiments, gallium nitride when epitaxially grown on a silicon (111) substrate advances in a direction parallel to a close-packed or basal plane of the gallium nitride. The resulting growth front 416 may then have a hexagonal geometry.

Figure 4C:
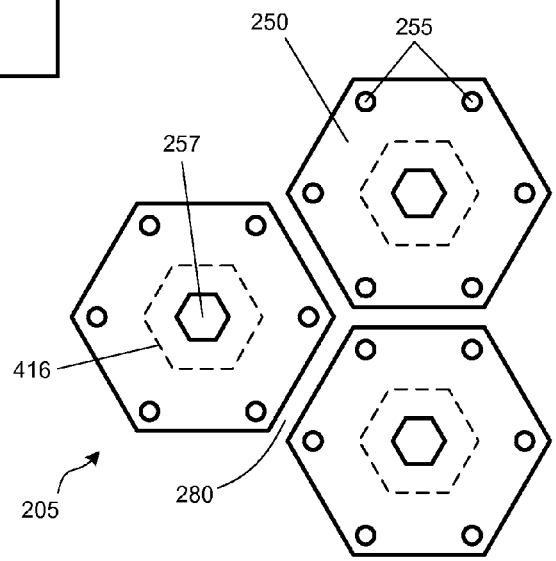

The lateral-growth guiding structures 200 may be in any suitable geometry. For example the confining cover layer 250 of a lateral-growth guiding structure may be formed in a square shape, a rectangular shape, a pentagonal shape, a rhombohedral shape, a triangular shape, and octagonal shape, or a hexagonal shape, the latter of which is depicted in FIG. 4C. Other shapes may be used in other embodiments.

In some embodiments, a plurality of the lateral-growth guiding structures may be formed as an array 205 at as depicted in FIG. 4C. The array may be distributed across the region of the substrate, or an entire surface of a substrate. In various embodiments, mesh openings 280 may be formed between the lateral-growth guiding structures in the array. The mesh openings need not be connected and may be discrete openings distributed across the array. In some embodiments, the selective growth area 255 may have any suitable geometry. For example, the selective growth area may be formed as a hexagonal opening as indicated by the depressions 257 in FIG. 4C. The orientation of the selective growth area 255 may, in some embodiments, be matched to a crystal orientation of the seed structure or epitaxially grown semiconductor.

Figure 4D:
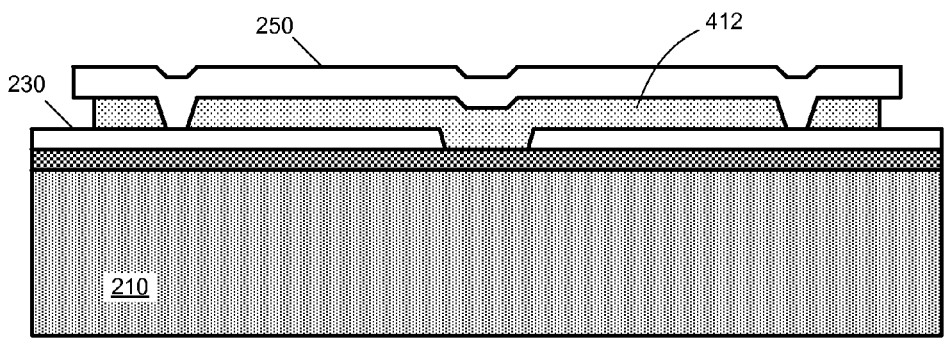

As may be appreciated from the drawing of FIG. 4C, the epitaxially-grown semiconductor may advance across the confining region 240 in each lateral-growth guiding structure 202 to cover a majority of the substrate surface. FIG. 4D depicts an elevation view of a laterally-grown heteroepitaxial gallium nitride base layer 412 that has nearly filled the lateral-growth guiding structure. The growth of the base layer 412 may be a timed growth that is stopped before the growth front 416 of the epitaxial base layer reaches the edge of the confining cover layer 250. Referring again to FIG. 4C, the laterally grown base layer 412 may cover between approximately 80% and approximately 99% of a surface of a substrate. In some embodiments, the laterally grown base layer may cover between approximately 90% and approximately 99% of a surface of a substrate. According to some implementations, the laterally grown base layer 412 may be intentionally terminated before reaching the edge of the confining cover layer and therefore cover less than 80% of the surface of the substrate.

Figure 4E:
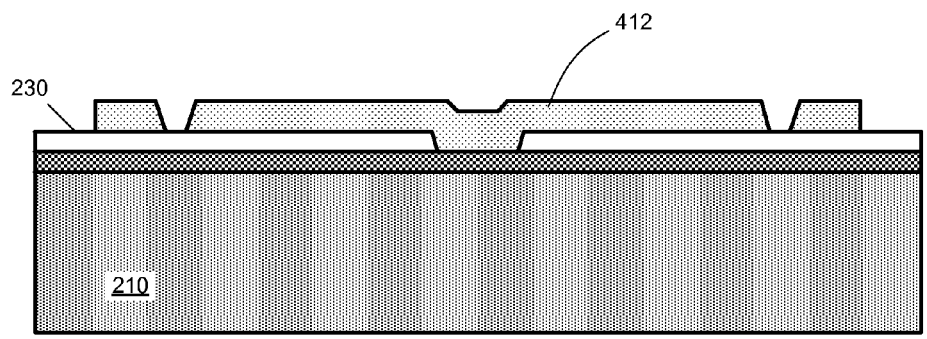
FIG. 4E depicts a laterally grown base semiconductor layer, according to some embodiments.
Figure 4F:
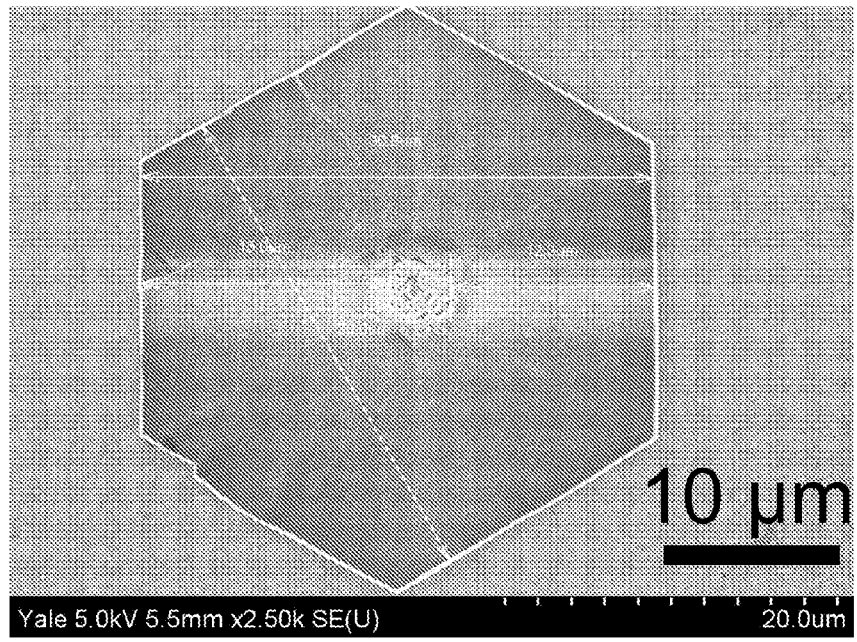
FIG. 4F is a scanning electron microscope (SEM) image of a base semiconductor layer, according to some embodiments.

After growth of the base layer 412, the confining cover layer 250 may be removed from the substrate to expose the base layer, as depicted in FIG. 4E. The confining cover layer may be removed by any suitable process, such as a wet or dry etching process. FIG. 4F shows a scanning electron microscope (SEM) image of a GaN base layer 412 formed on an insulating film from a selective growth area of (111) Si after removal of the cover layer 250. The SEM image shows a high defect concentration at the center of the base layer near the selective growth area, and lower defect concentrations toward the periphery of the base layer.

Figure 4G:
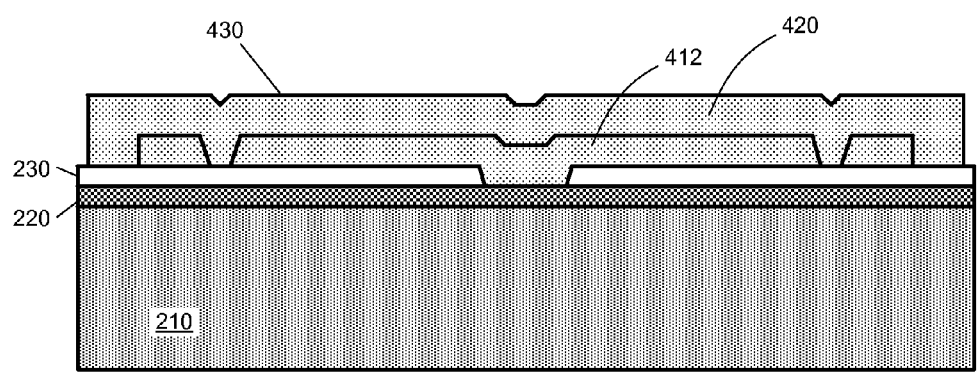
FIG. 4G illustrates an elevation view of a semiconductor tile after a regrowth process, according to some implementations.
Figure 4H:
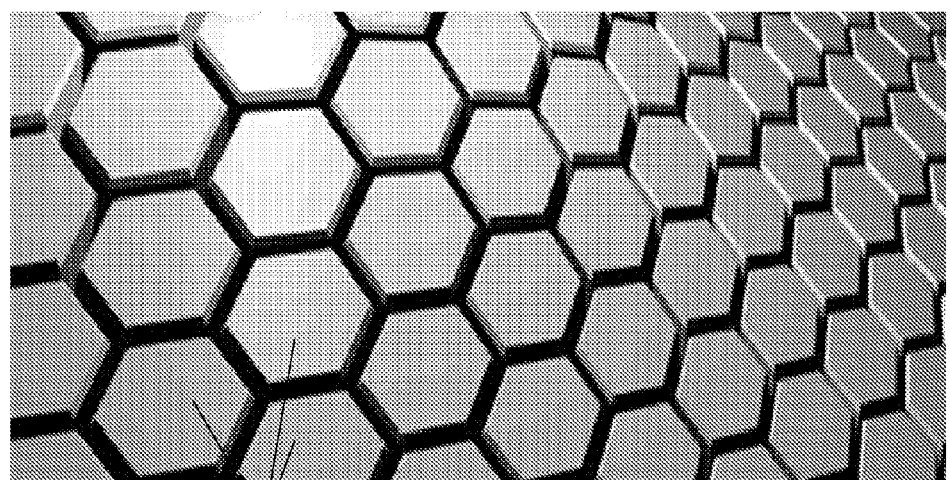
FIG. 4H depicts an array of semiconductor tiles formed on a substrate via confined lateral guided growth, according to some embodiments.

The substrate may then be subjected to a second epitaxial regrowth process to form a regrowth layer 420 over the base layer 412, as depicted in FIG. 4G. The regrowth process may form a gallium nitride tile 430 over an area of the substrate at the former location of each lateral-growth guiding structure 200. During the regrowth process, the regrowth layer 420 may proceed both vertically and horizontally. Accordingly, the lateral dimension of the gallium nitride tile 430 may increase during the regrowth process. Referring again to FIG. 4C, it may be appreciated that the size of the formed tile 430 may extend beyond the edge of a confining cover layer 250, so as to cover more surface area of the substrate than the confining cover layer. In various embodiments, a gap 440 will remain between adjacent tiles 430, as depicted in FIG. 4H.

The regrowth layer 420 may be any suitable thickness between approximately 200 nm and approximately 2 µm.

The regrowth process may be carried out under second growth conditions that are different from the first growth conditions used to form the base layer 412. The temperature during the second growth conditions may be between approximately 1050° C. and approximately 1100° C. According to some embodiments, the pressure may be between approximately 40 mbar and approximately 100 mbar. The ammonia flow rate may be between approximately 2 slm and approximately 5 slm, in some embodiments. In some implementations of the regrowth, the flow rate of the trimethylgallium gas may be between approximately 20 µmol per minute and approximately 40 µmol per minute. In other embodiments, growth conditions higher or lower than these ranges may be used. In some embodiments, improved quality of the regrowth layer is observed with temperatures between approximately 1070° C. and approximately 1100° C., a pressure, between approximately 40 mbar and approximately 60 mbar, a flow rate of $NH_3$ between approximately 3 slm and approximately 5 slm, and a TMGa flow rate of approximately 30 µmol per minute. Unsatisfactory growth was observed for temperatures below 1030° C., pressure above 300 mbar, $NH_3$ flow rates below 1 slm, and TMGa flow rates above 110 µmol per minute. Unsatisfactory growth exhibited very rough surface morphology.

Formation of the regrowth layer 420 may proceed with a reduced number of defects. Additionally, formation of the regrowth layer may improve the surface quality of the gallium nitride tile 430. In some embodiments, formation of the regrowth layer 420 reduces a concentration of defects of about $10^8$ per centimeter squared or more near the selective growth area 255 to a concentration less than $10^8$ per centimeter squared near an upper surface of the gallium nitride tile 430. In some embodiments, the concentration may be reduced to a value of about $10^5$ per centimeter squared near an upper surface of the gallium nitride tile 430. In some implementations, the defect density may drop to less than $10^8$ $cm^{-2}$ in an outer half of the tile surface. In some cases, the defect density may drop to approximately $10^5$ $cm^{-2}$ or less in an outer half of the tile surface. In some embodiments, an upper surface of the gallium nitride tiles 430 may be smoothed using a CMP process.

As may be appreciated from FIGS. 4G-4H, the gallium nitride tiles 430 may form with reduced stress. For example the thin insulating layer 230 provides a measure of stress release between the seed structure 220 and the base layer 412 formed during the first growth and subsequently the gallium nitride tile 430. In some embodiments, the laterally-grown gallium nitride may slip across the insulating layer 230 to relieve stress in the base layer 412. Additionally, gaps 440 between the tiles 430 may provide further stress release of the gallium nitride. In some embodiments, stress in the gallium nitride may be higher near the selective growth area 255 and lower near the periphery of a gallium nitride tile.

As may be appreciated from the foregoing description of heteroepitaxial CLGG, the thickness of a high quality monocrystalline layer can be tailored by the lateral-guiding growth structure, so that high L/V growth rates can be achieved. In conventional ELO process, to obtain large-area coverage, thicknesses of the grown semiconductor can typically exceed 10 µm due to lower L/V growth rates. The thickness of GaN can be controlled and tailored to 1 µm or less depending on design. Additionally, stress induced by thermal expansion mismatches can be greatly reduced since the GaN tiles are not continuous over the entire wafer. Gaps between the tiles can provide for additional stress relief due to thermal mismatch. Accordingly, CLGG should be scalable to 12" wafers, since thermal stress is much mitigated. CLGG can eliminate a need for complicated AlGaN buffer and interlayers, in some embodiments. In some implementations, buffer layers may be used to further reduce stress and defect densities at the selective growth area. According to some embodiments, GaN device layers formed by the above-described methods can be electrically insulated from silicon with no shunt current paths due to the insulating layer 230.

EXPERIMENTS AND NUMERICAL SIMULATIONS

Several experiments and numerical simulations were carried out to further understand the growth of gallium nitride in the lateral growth confining structures. Results of these experiments and simulations are described in this section. In some cases, results from the numerical simulations matched well with experimental results.

Figure 5A:
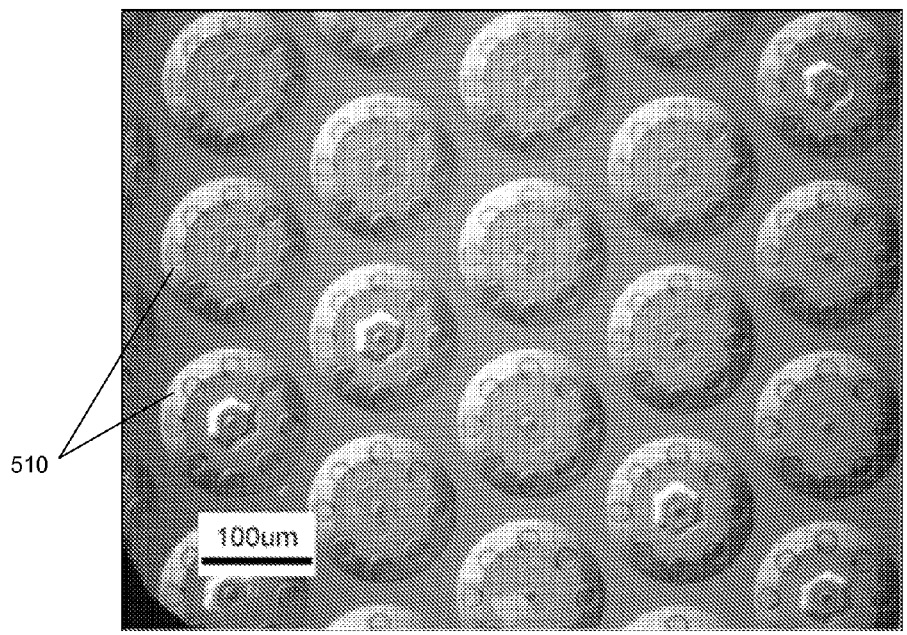
FIG. 5A is a microscope (Nomarski) image of an array of lateral-growth guiding structures formed on a substrate, according to some embodiments.

In a first experiment, an array of lateral-growth guiding structures 510 were formed on a substrate, as depicted in FIG. 5A. In this experiment, a silicon(111) substrate was used. Approximately 150 nm of aluminum nitride (AlN) was deposited by MOCVD on the surface of the silicon substrate. Following the deposition of the aluminum nitride, approximately 300 nm of silicon dioxide was deposited over the seed layer by PECVD. Circular holes were formed in the first insulating layer using conventional photolithography. The circular holes exposed a circular selective growth area 255 on the aluminum nitride surface. A range of sizes were trialed for the selective growth areas. The diameter of the selective growth areas ranged from approximately 1 µm to approximately 10 µm.

Subsequently, approximately 500 nm of amorphous silicon was deposited as the sacrificial layer 320. Eight holes were opened in the sacrificial layer around selective growth area. Approximately 700 nm of the silicon dioxide was deposited over the amorphous silicon and sacrificial layer 320. The covering layer of silicon dioxide was patterned using photolithography and a wet etch to form mesh openings 280 between the array of lateral-growth guiding structures and to expose the underlying sacrificial layer. The amorphous silicon was removed using a high-pressure dry etch comprising $XeF_2$. The substrate was then subjected to heteroepitaxial laterally-guided growth via MOCVD. The growth of a base layer was carried out at approximately 980° C., a pressure of approximately 300 mbar, an ammonia gas flow rate of approximately 0.5 slm, and a trimethylgallium gas flow rate of approximately 15 sccm. The growth proceeded for approximately 2 hours.

The resulting structures are shown in FIG. 5A, which is a microscope image of a region of the substrate. The circular lateral-growth guiding structures 510 are approximately 130 µm in diameter. At the center of each structure is a hexagonally-shaped base layer of gallium nitride formed within a lateral-growth guiding region 240. The base layer of gallium nitride is optically visible through the transparent silicon dioxide confining cover layer. The growth of the base layer was terminated before the growth front of the gallium nitride reached the periphery of the growth guiding structures. The lateral extent of some gallium nitride base layers is approximately 50 µm. The L/V growth rate ratio for these lateral-growth guiding structures was found to be approximately 30.

Figure 5B:
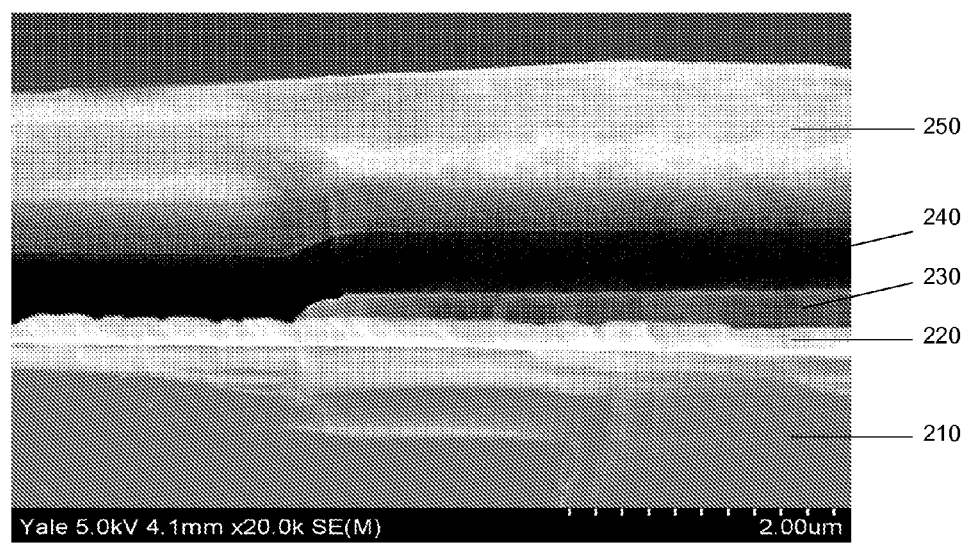
FIG. 5B is a scanning electron microscope (SEM) image showing an elevation view of a lateral-growth guiding structure, according to some implementations.

FIG. 5B shows a scanning electron microscope (SEM) image of a cross-section near the center of the lateral-growth guiding structure before growth of gallium nitride. The substrate 210, seed structure 220, first insulating layer 230, lateral-growth guiding region 240, and confining cover layer 250 can be seen in the image. The image shows the exposed seed structure 220 at the selective growth area and a substantially uniform separation between the confining cover layer 250 in the first insulating layer 230.

Figure 5C:
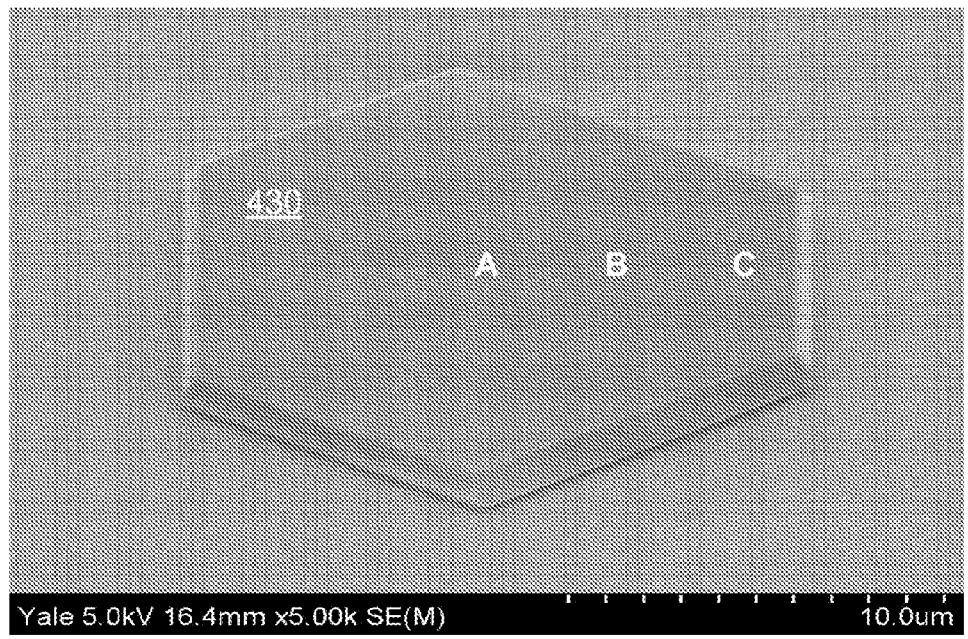
FIG. 5C is an SEM image of a tilted (45°) GaN tile formed by lateral guided growth and regrowth steps, according to some implementations. Strain measurements were made at the lettered locations were found to be (A) 0.069%, (B) 0.042%, and (C) 0%.
Figure 5D:
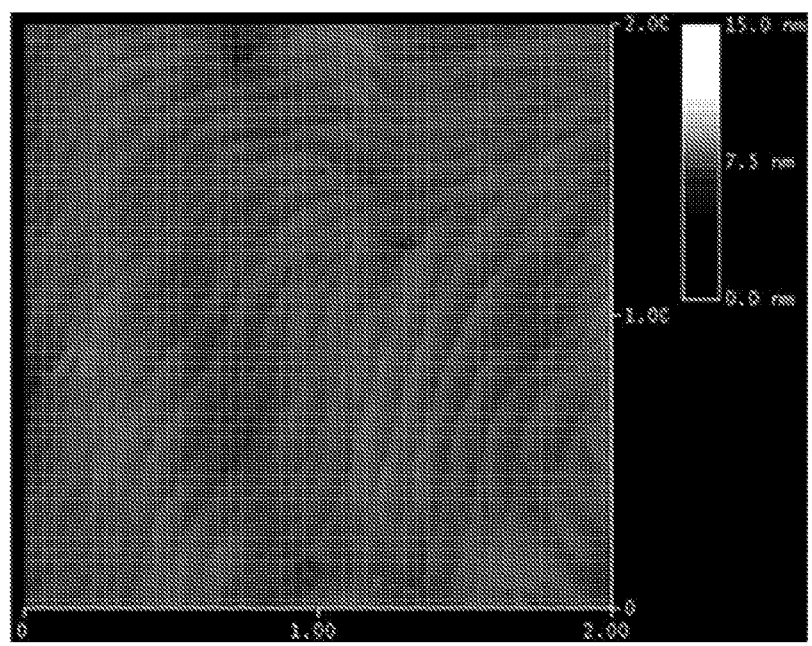
FIG. 5D is an atomic force microscope (AFM) image of a surface of the tile depicted in FIG. 5C.

After formation of the gallium nitride-based layers 412, the confining cover layer was removed from the substrate. The substrate was then subjected to the second regrowth conditions to form gallium nitride tiles. FIG. 5C is an SEM image of a regrown gallium nitride tile. The regrowth process was carried out at approximately 1030° C., a pressure of approximately 60 mbar, an ammonia flow rate of approximately 2 slm, and a flow rate of the trimethylgallium gas of approximately 10 sccm. The regrowth process was carried out for approximately 20 minutes. As can be seen from the SEM image, the upper surface of the gallium nitride tile is substantially smooth. The surface was scanned within atomic force microscope (AFM) to produce the image shown in FIG. 5D. The AFM image shows surface variations less than 10 nm. Some of the lines in the AFM image may be edges of atomic planes.

The strain in GaN tile is estimated by micro-Raman measurement with laser beam diameter of 0.5 µm. Strain was measured at three locations (A, B, C) of the GaN tile. The measurement locations are depicted in FIG. 5C. $E_2$ peaks of GaN for position A, B and C were 566.2, 566.7 and 567.3 $cm^{-1}$, respectively. According to the referred $E_2$ peak position of free-standing bulk GaN at 567.1 $cm^{-1}$, the strains are calculated to be ~0.069%, 0.042% and 0 for position A, B and C, respectively. Strain was found to be highest at the center of the tile, and no strain was measured near the periphery of the tile. The strain in the center position near to the seed is low due to the small contacting area between GaN tile and Si substrate. A majority of the area of the GaN tile is strain-free.

Figure 6B:
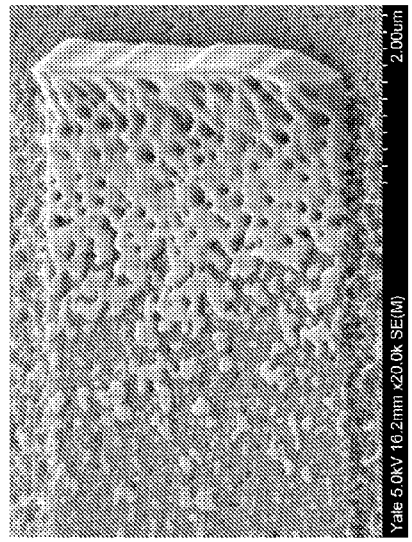
Figure 6D:
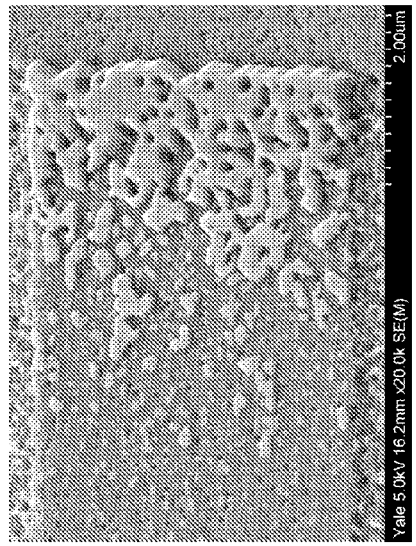
Figure 6A:
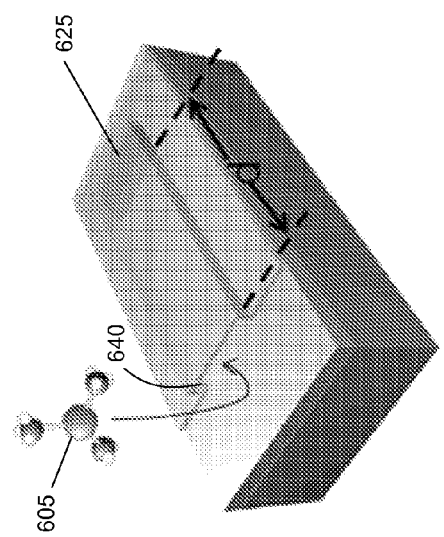
FIG. 6A depicts the geometry of a test structure fabricated to study lateral guided heteroepitaxial growth of GaN.
Figure 6C:
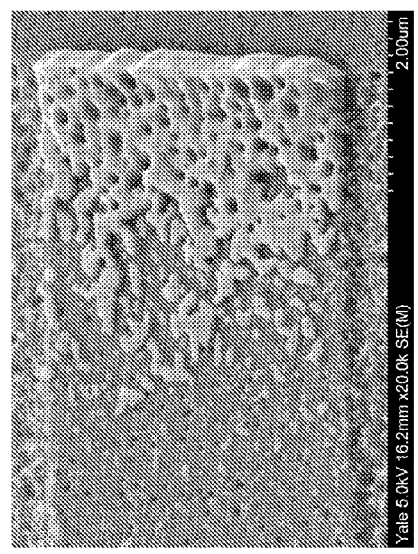

To better understand the growth dynamics in a lateral-growth guiding structure, numerical simulations were carried out for a structure depicted in FIG. 6A. To evaluate the accuracy of the numerical simulations, a corresponding experiment was also conducted. The lateral-growth guiding structure comprised a confined channel having an opening 640 at the near end, and a selective growth area 625 at a far end of the channel. The length along the direction of the channel of the selective growth area was approximately 5 µm. The channel was approximately 5 µm wide and had an opening height of approximately 1 µm. To form gallium nitride layers at the selective growth area gas molecules 605 must travel down the channel to reach the selective growth area.

Figure 6G:
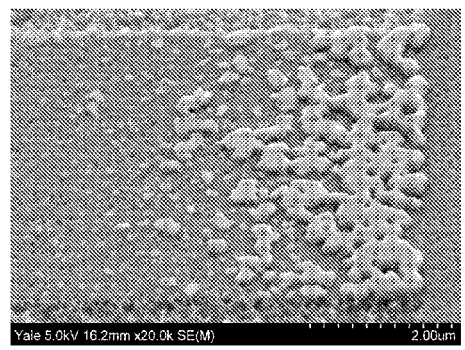
FIG. 6G represents a graph of surface structures measured by atomic force microscopy corresponding to the results shown in FIGS. 6B-6F.
Figure 6G:
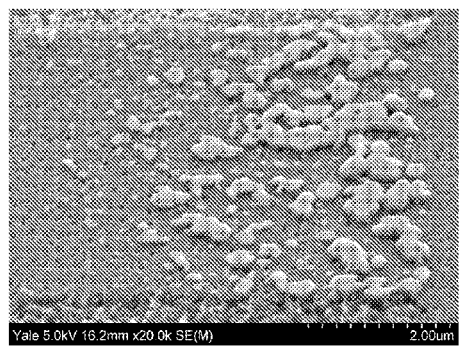
Figure 6G:
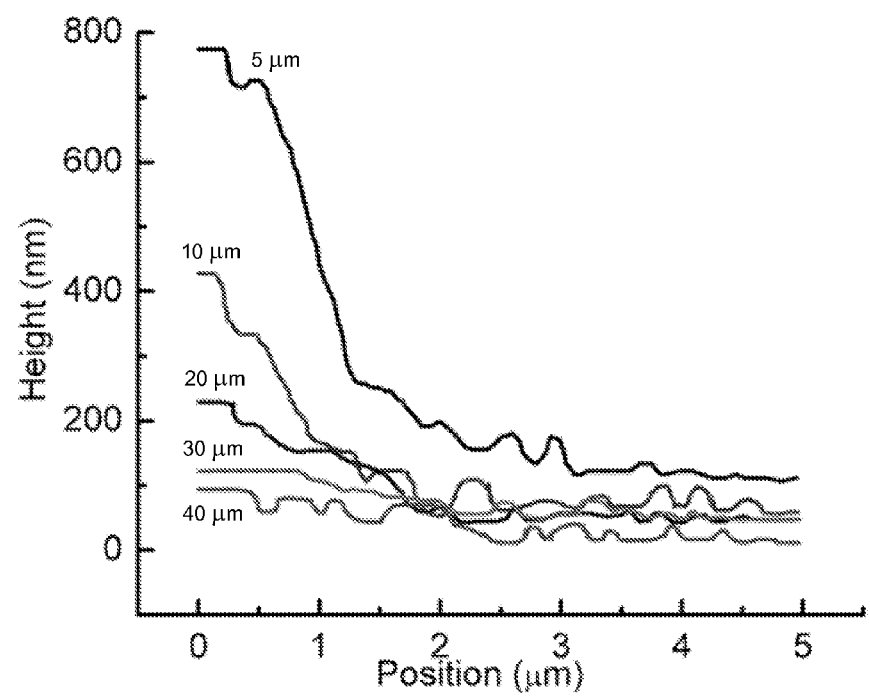

Several channels were microfabricated having different depths d. The different depths trialed were 5 µm, 10 µm, 20 µm, 30 µm, and 40 µm. FIGS. 6B-6F are SEM images showing the resulting heteroepitaxial structures formed over the selective growth area. FIG. 6B depicts the results when the depth of the channel was 10 µm, and the remaining FIGS. 6C-6F depict the results for increasingly longer channel depths. The right edge of FIG. 6B shows the formation of a layer of gallium nitride at an edge of the selective growth area 625 toward the opening 640 of the channel. The thickness of the gallium nitride layer decreases at greater depths into the channel across the selective growth area. For the channel having the greatest depth, the formation of gallium nitride is very sparse over the selective growth area as can be seen in FIG. 6F. FIG. 6G represents atomic force microscope measurements of the heights of the epitaxially grown gallium nitride layers for each of the regions shown in FIGS. 6B-6F.

Figure 7A:
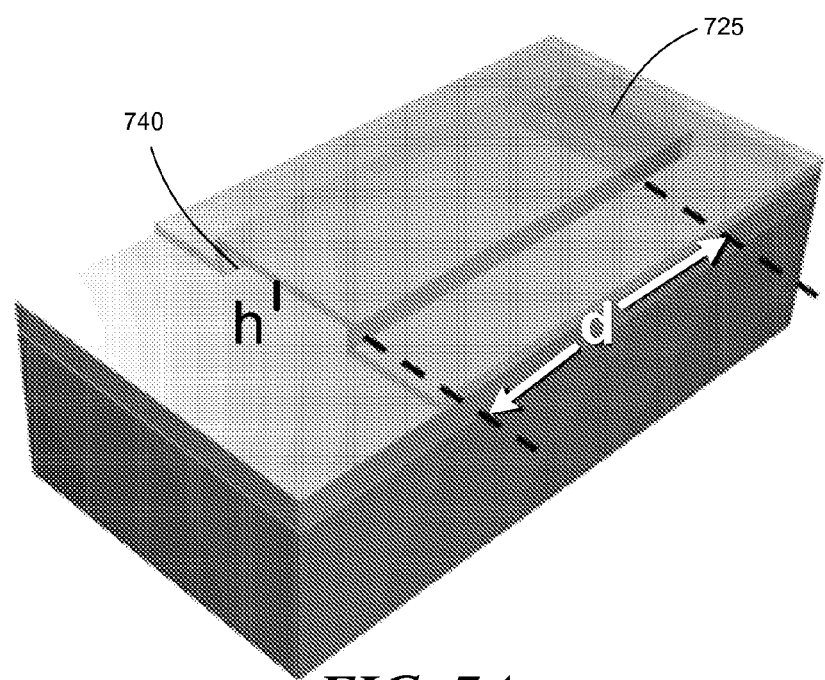
FIG. 7A illustrates the geometry of a lateral-growth guiding channel used for numerical simulations of the heteroepitaxial growth of GaN, according to some embodiments.
Figure 7B:
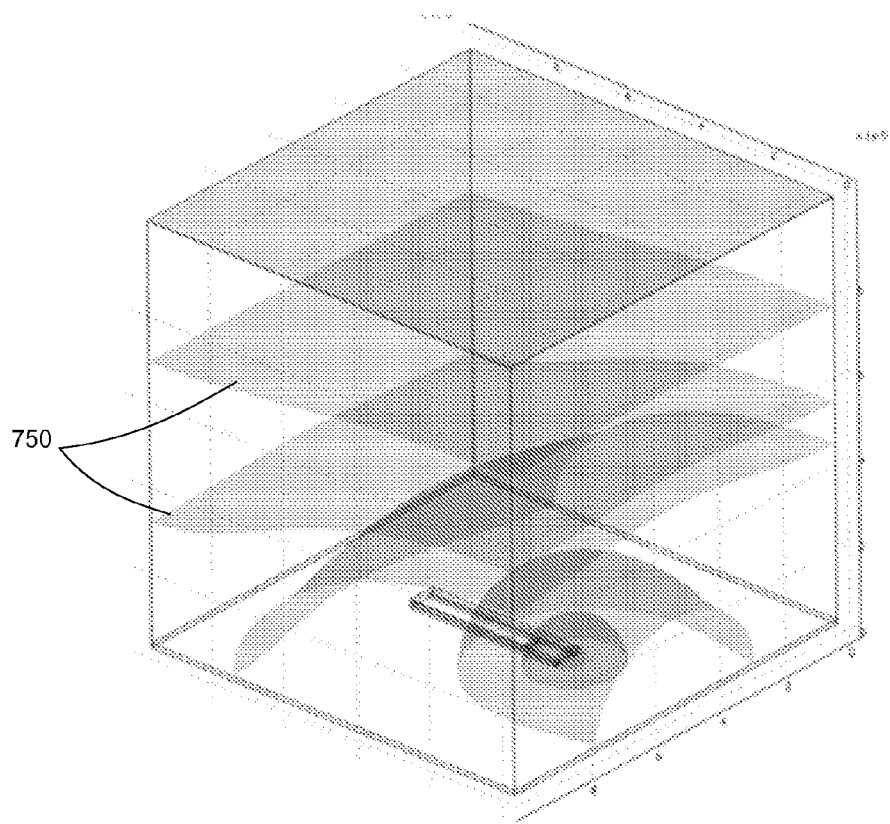
FIG. 7B depicts numerically-simulated contours of equipotential during epitaxial growth of gallium nitride in the lateral-growth guiding channel.

A corresponding lateral-growth guiding structure was used for the numerical simulations as depicted in FIG. 7A. The height h of the channel opening 740 was approximately 1 μm, and the width of the channel at the opening was approximately 10 μm. The same channel depths the were used in the simulation as in the experiment. The electric potential was modeled in the vicinity of the lateral-growth guiding structure. Isocontours 750 of the electric potential are plotted in FIG. 7B. The resulting electric field and diffusivity of the gas molecules assist in the transport of the gas molecules to and from the selective growth area 725. The diffusivity for the simulation was approximately $11 \times 10^4$ $m^2\ s^{-1}$, and the reaction rate k was approximately 158 m/s.

Figure 7C:
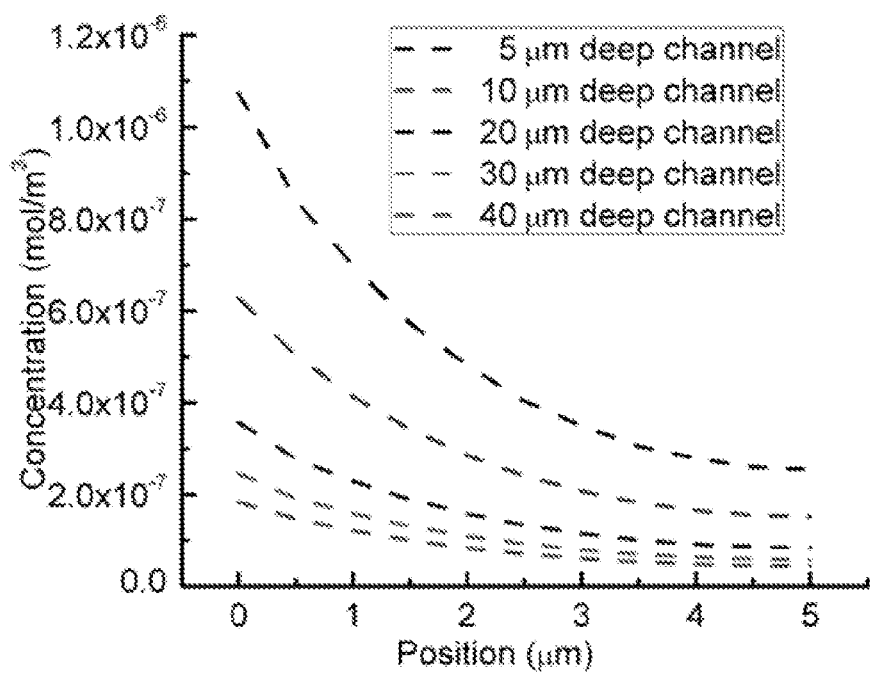
FIG. 7C-7E are graphs of gas concentration and growth rate obtained from the numerical simulation of heteroepitaxial growth in the lateral-growth guiding channel, according to some embodiments.
Figure 7D:
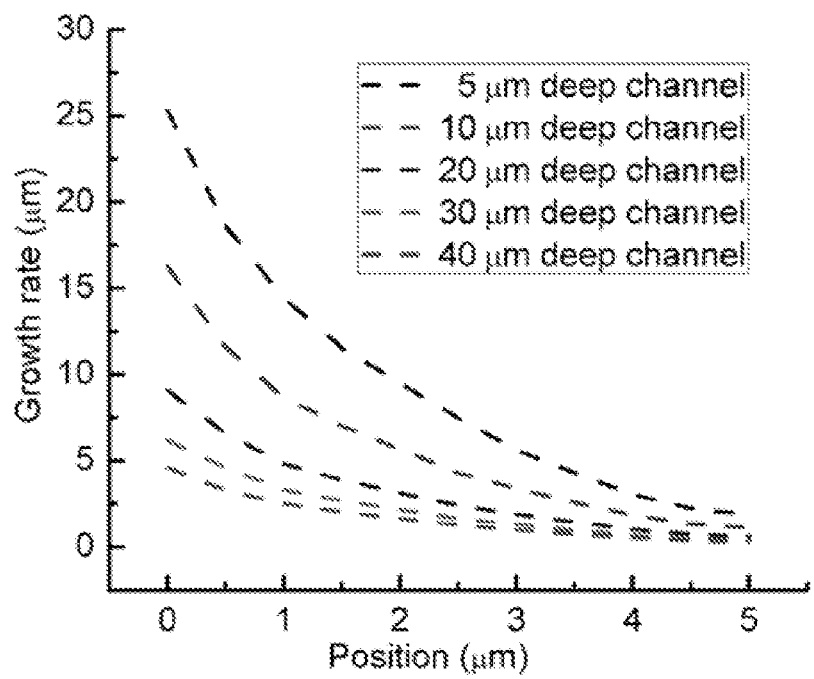

FIG. 7C is a numerical result of the concentration of reactant species above the selective growth area 725 as a function of position into the channel at the selective growth area. The zero location is taken at the edge of the selective growth area near the open end of the channel. For the shortest channel depth of 5 μm, the concentration of reactant species is higher at the near end of the selective growth area than for the longer channels. FIG. 7C represents a growth rate of the gallium nitride as a function of position across the selective growth area. In accordance with the concentration profiles of FIG. 7C, the growth rate is highest at the edge of the selective growth area near the open end of the channel. For the 5-μm-deep channel, the growth rate is approximately 25 μm/h.

Figure 7E:
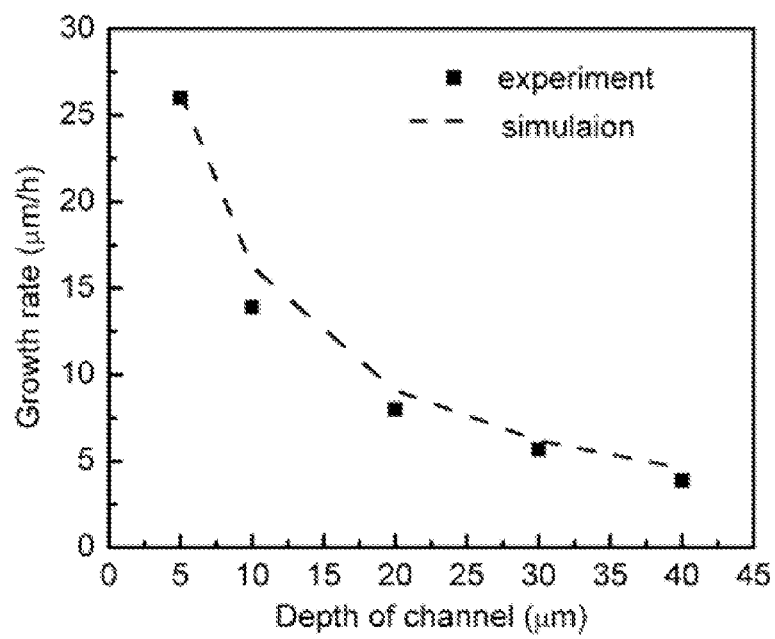

FIG. 7E compares the experimental results, shown as filled squares, against the numerical results, shown as the dashed line, for the growth rate as a function of channel depth. The experimental growth rates were determined by measuring the height of the gallium nitride at the edge of the selective growth area after a measured time of epitaxial growth. The results from the numerical simulation compare well with the experimental results.

Figure 7F:
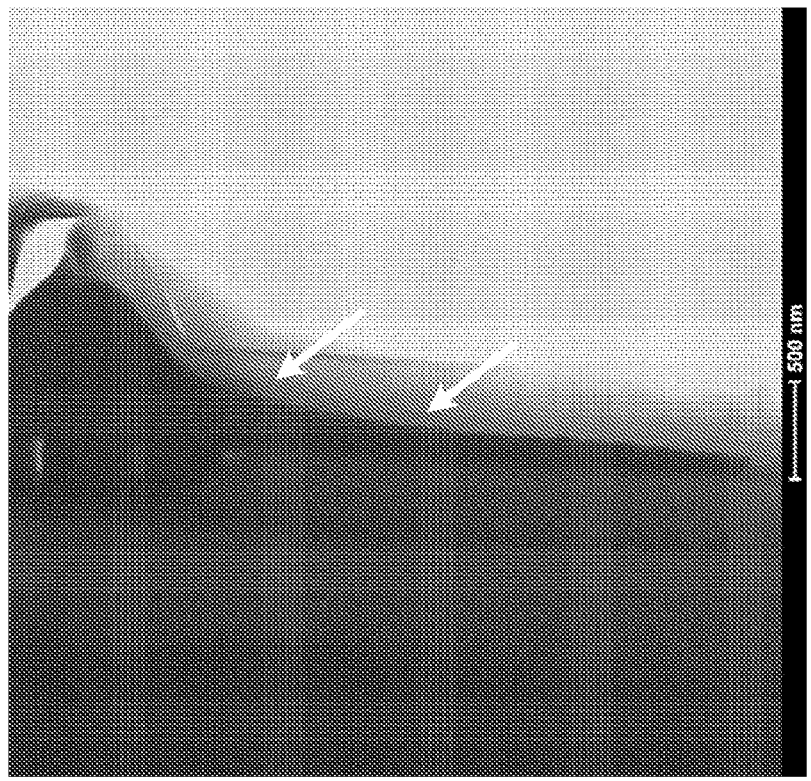
FIG. 7F depicts a transmission electron micrograph of a laterally-grown GaN tile on an insulating layer and silicon substrate.

Microstructural properties of a sample were also observed transmission electron microscopy (TEM). Images were taken under two beam condition with zone axis of $[11\bar{2}0]$ and g vector of $<10\bar{1}0>$. Due to the mask blocking effect, the dislocations in the underlying AlN are blocked by the floor $SiO_2$ mask except the seed region. Dislocations originated from the AlN seed region were observed to bend laterally into the GaN tiles as indicated by the arrows in FIG. 7F. Therefore the vertical dislocation propagating into the top surface is reduced dramatically. Further epitaxial growth may be employed to form device structures on the GaN tiles, in which case the dislocation density at the top device structures may be very low in comparison with GaN-based devices formed by conventional planar GaN epitaxy directly on Si substrates.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments. As may be appreciated, a large number of lateral-growth guiding structures or GaN tiles may be formed simultaneously using microfabrication processes.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for covering an area of a substrate with a semiconductor, the method comprising:
    forming a first insulating layer to cover a crystal seed structure, wherein the first insulating layer also covers the area of the substrate;
    opening at least one opening in the first insulating layer to expose at least one selective growth area that exposes a surface area of the seed structure;
    forming a second insulating layer parallel to the first insulating layer and spaced apart from the first insulating layer by a distance;
    removing a sacrificial material between the second insulating layer and first insulating layer region to form a lateral-growth guiding region for at least one selective growth area;
    heteroepitaxially growing the semiconductor under first growth conditions into the lateral-growth guiding region from the at least one selective growth area;
    removing the second insulating layer;
    epitaxially growing the semiconductor under second growth conditions to form at least one semiconductor tile covering a portion of the area of the substrate;
    depositing the sacrificial material over the first insulating layer;
    depositing the second insulating layer over the sacrificial material; and
    etching vias through the sacrificial material to expose surface areas of the first insulating layer, wherein forming the second insulating layer comprises filling the vias in the sacrificial material with the second insulating material.

2. The method of claim 1, wherein the distance is between approximately 0.2 μm and approximately 2 μm.

3. The method of claim 1, wherein a lateral extent of the at least one opening in the first insulating layer is between approximately 0.2 μm and approximately 10 μm.

4. The method of claim 1, wherein the semiconductor is GaN.

5. The method of claim 4, further comprising growing the gallium nitride under the first growth conditions to a lateral extent between approximately 5 μm and approximately 50 μm from the at least one opening, and wherein the distance is between approximately 0.2 μm and approximately 2 μm.

6. The method of claim 4, further comprising growing the gallium nitride tile to a thickness between approximately 0.2 μm and approximately 2 μm.

7. The method of claim 4, wherein growing the GaN under the first growth conditions comprises forming a close-packed plane of the GaN parallel to a direction of the lateral growth.

8. The method of claim 4, wherein both the first growth conditions and the second growth conditions comprise providing a first gas containing nitrogen and a second gas containing gallium to the selective growth area.

9. The method of claim 8, wherein the first gas is ammonia and the second gas is trimethylgallium.

10. The method of claim 9, wherein a temperature for the first growth conditions is between approximately 950° C. and approximately 1050° C.

11. The method of claim 9, wherein a pressure for the first growth condition is between approximately 100 mbar and approximately 400 mbar.

12. The method of claim 9, wherein a flow rate of the first gas for the first growth condition is between approximately 0.5 slm to approximately 3 slm.

13. The method of claim 9, wherein a flow rate of the second gas for the first growth condition is between approximately 40 µmol per minute and approximately 110 µmol per minute.

14. The method of claim 9, wherein a temperature during the second growth condition is between approximately 1050° C. and approximately 1100° C.

15. The method of claim 9 wherein a pressure during the second growth condition is between approximately 40 mbar and approximately 100 mbar.

16. The method of claim 9, wherein a flow rate of the first gas for the second growth condition is between approximately 2 slm and approximately 5 slm.

17. The method of claim 9, wherein a flow rate of the second gas for the second growth condition is between approximately 20 µmol per minute and approximately 40 µmol per minute.

18. The method of claim 8, wherein the ratio of gallium to nitrogen for the second growth condition is higher than a ratio of gallium to nitrogen for the first growth condition.

19. The method of claim 8, where in a pressure for the first growth condition is approximately equal to or higher than a pressure for the second growth condition.

20. The method of claim 8, wherein a temperature for the second growth condition is approximately equal to or higher than a temperature for the first growth condition.

21. The method of claim 1, wherein forming the first insulating layer comprises depositing a dielectric material to cover the crystal seed structure.

22. The method of claim 21, wherein the dielectric material comprises silicon nitride or silicon oxide.

23. The method of claim 1, wherein opening at least one opening in the first insulating layer comprises etching a via through the first insulating layer.

24. The method of claim 1, wherein the seed structure comprises aluminum nitride.

25. The method of claim 1, wherein the seed structure comprises a multilayer stack including at least one layer of gallium nitride.

26. The method of claim 1, wherein the second insulating layer comprises an oxide or a nitride.

27. The method of claim 1, wherein the sacrificial material comprises polysilicon.

28. The method of claim 1, wherein the removing the sacrificial material comprises etching the sacrificial material with a wet or dry etching process.

29. The method of claim 28, wherein the dry etching process comprises an etching process that uses the gas $XeF_2$.

30. The method of claim 29, wherein a pressure during the etching is between approximately 1 Torr and approximately 20 Torr.

31. The method of claim 29, wherein a flow rate of the $XeF_2$ is between approximately 0.5 slm and approximately 2 slm.

* * * * *